United States Patent
Zhang

(10) Patent No.: US 10,831,305 B2
(45) Date of Patent: Nov. 10, 2020

(54) GATE DRIVING CIRCUIT AND DRIVING METHOD OF THE SAME, ARRAY SUBSTRATE AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Jie Zhang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 33 days.

(21) Appl. No.: 15/768,710

(22) PCT Filed: Jul. 18, 2017

(86) PCT No.: PCT/CN2017/093318
§ 371 (c)(1),
(2) Date: Apr. 16, 2018

(87) PCT Pub. No.: WO2018/201620
PCT Pub. Date: Nov. 8, 2018

(65) Prior Publication Data
US 2018/0335884 A1 Nov. 22, 2018

(51) Int. Cl.
*G06F 3/041* (2006.01)
*G09G 3/20* (2006.01)
(Continued)

(52) U.S. Cl.
CPC ......... *G06F 3/0416* (2013.01); *G09G 3/2092* (2013.01); *G09G 3/3266* (2013.01);
(Continued)

(58) Field of Classification Search
CPC .. G06F 3/0416; G09G 3/3266; G09G 3/3677; G09G 3/2092; G09G 2310/0286;
(Continued)

(56) References Cited

U.S. PATENT DOCUMENTS 9,626,028 B2 4/2017 Li et al.
9,727,162 B2 8/2017 Hao
(Continued)

FOREIGN PATENT DOCUMENTS

CN 103050106 A 4/2013
CN 103714792 A 4/2014
(Continued)

OTHER PUBLICATIONS

International Search Report dated Jan. 29, 2018, issued in counterpart application No. PCT/CN2017/093318. (13 pages).
(Continued)

*Primary Examiner* — Roberto W Flores
(74) *Attorney, Agent, or Firm* — Westerman, Hattori, Daniels & Adrian, LLP

(57) ABSTRACT

The present invention is related to a gate driving circuit. The gate driving circuit may comprise at least two scan modules coupled to a same clock signal. Each of the at least two scan modules may have an input terminal, a reset terminal, and at least one stage of shift register unit. The reset terminal of at least one of the at least two scan modules is coupled to a touch control enable signal line.

12 Claims, 6 Drawing Sheets

(51) Int. Cl.
  *G11C 19/28* (2006.01)
  *G09G 3/36* (2006.01)
  *G09G 3/3266* (2016.01)
(52) U.S. Cl.
  CPC .......... *G09G 3/3677* (2013.01); *G11C 19/28* (2013.01); *G09G 2310/0267* (2013.01); *G09G 2310/0286* (2013.01)
(58) Field of Classification Search
  CPC ......... G09G 2310/0267; G09G 3/3275; G09G 3/3674; G09G 3/3969; G09G 2310/06–08; G09G 2310/0289; G09G 2310/0294; G11C 19/28; G11C 29/86; G11C 29/20; G11C 27/04
  USPC ...................... 377/64–81; 345/100
  See application file for complete search history.

(56) References Cited

U.S. PATENT DOCUMENTS

| | | | |
|---|---|---|---|
| 2010/0272228 A1* | 10/2010 | Hsiao | G11C 19/184 377/79 |
| 2014/0049512 A1* | 2/2014 | Yang | G06F 3/0412 345/174 |
| 2014/0176410 A1* | 6/2014 | Ma | G09G 3/3622 345/92 |
| 2015/0213762 A1* | 7/2015 | Xia | G09G 3/3266 345/215 |
| 2015/0346904 A1* | 12/2015 | Long | G09G 3/3677 345/174 |
| 2015/0356934 A1* | 12/2015 | Yamashita | G09G 3/3611 345/205 |
| 2016/0049126 A1* | 2/2016 | Zhang | G09G 3/3648 345/173 |
| 2016/0086562 A1* | 3/2016 | Tan | G09G 3/3677 345/215 |
| 2016/0188076 A1* | 6/2016 | Hao | G06F 3/0416 345/173 |
| 2017/0052635 A1* | 2/2017 | Yu | G06F 3/044 |
| 2017/0124969 A1* | 5/2017 | Dai | G09G 3/3648 |
| 2017/0213499 A1* | 7/2017 | Kong | G11C 19/28 |

FOREIGN PATENT DOCUMENTS

| | | |
|---|---|---|
| CN | 203673454 U | 6/2014 |
| CN | 104240631 A | 12/2014 |
| CN | 104537994 A | 4/2015 |
| CN | 106326859 A | 1/2017 |
| JP | 2007183192 A | 7/2007 |
| JP | 2011085680 A | 4/2011 |

OTHER PUBLICATIONS

Office Action dated Dec. 11, 2019, issued in counterpart CN application No. 201710309533.1, with English translation. (18 pages).

* cited by examiner

GATE DRIVING CIRCUIT AND DRIVING METHOD OF THE SAME, ARRAY SUBSTRATE AND DISPLAY APPARATUS

CROSS-REFERENCE TO RELATED APPLICATIONS

This application claims the benefit of the tiling date of Chinese Patent Application No. 201710309533.1 filed on May 4, 2017, the disclosure of which is hereby incorporated by reference.

TECHNICAL FIELD

This invention relates to a display technology, and more particularly, to a gate driving circuit and a driving, method of the same, an array substrate and a display apparatus.

BACKGROUND

Compared to traditional processes, gate driver on Array (GOA) technology not only saves cost and achieves a symmetrical design on both sides of a display panel, but also saves binding area of a chip and, for example, wiring space of a far-out region, thereby facilitating implementing a narrow border design. Meanwhile, due to the GOA technology, chip binding process in a row direction can be omitted, thereby enhancing overall production capacity and yield.

In a GOA circuit applied to a Touch Screen Panel (TSP), in order to realize alternate touch scans and display scans in each display frame, it is necessary to control the GOA circuit to suspend the display scan during the touch scan period and then continue the display scan after the touch scan ends. As a result, in general, two or more control signal lines are needed for each touch scan period and each added control signal line occupies a certain wiring space and requires a corresponding signal port. This is disadvantageous for simplifying GOA circuit structure and narrowing display borders.

BRIEF SUMMARY

Accordingly, one example of the present disclosure is a gate driving circuit. The gate driving circuit may comprise at least two scan modules coupled to a same clock signal. Each of the at least two scan modules may have an input terminal, a reset terminal, and at least one stage of shift register unit. The reset terminal of at least one of the at least two scan modules may be coupled to a touch control enable signal line. Each of the at least two scan modules may be configured to enable the at least one stage of the shift register unit thereof to output a gate turning-on voltage stage by stage, starting from the first stage, in accordance with a flip of a level of the clock signal when the input terminal thereof receives an active level and to stop the last stage of the shift register unit thereof from outputting a gate turning-on voltage when the reset terminal thereof receives an active level.

A display period the gate driving circuit corresponds to may include alternate display scan periods and touch scan periods. Each of the at least two scan modules may correspond to one of the display scan periods respectively. The touch control enable signal line may be configured to load an active level at the reset terminal during each of the touch scan periods. Each of input terminals of the at least two scan modules may be coupled to a start signal line respectively.

Among the at least two scan modules other than scan modules whose reset terminals are coupled to the touch control enable signal line, a reset terminal of at least a current scan module may be coupled to an input terminal of a subsequent scan module. The subsequent scan module is a scan module whose corresponding display scan period is most closely subsequent to a display scan period the current scan module corresponds to.

A reset terminal of a scan module corresponding to a last display scan period in the display period may be coupled to an input terminal of a scan module corresponding to a first display scan period of a next display period.

Each of the at least one stage of the shift register unit may comprise an input terminal; an output terminal; and a reset terminal. An input terminal of a first stage of shift register unit in a scan module may be coupled to an input terminal of the scan module. A reset terminal of a last stage of shift register unit in the scan module may be coupled to a reset terminal of the scan module.

In a scan modulo having more than one stage of shift register units, except a first stage of the shift register, an input terminal of any of the remaining stages of shift register units may be coupled to an output terminal of a previous stage of shift register unit. Furthermore, except a last stage of the shift register unit, a reset terminal of any of the remaining stages of shift register units may be coupled to an output terminal of a next stage of shift register unit. The clock signal may be provided by a first clock signal line and a second clock signal line.

Each of the at least one stage of the shift register unit may comprise a first transistor, a first capacitor, a second transistor, a third transistor, a fourth transistor, and a fifth transistor. A gate of the first transistor may be coupled to a first electrode of the first capacitor C1, a first electrode thereof may be coupled to the first clock signal line, and a second electrode thereof may be coupled to an output terminal of the shift register unit. A second electrode of the first capacitor C1 may be coupled to the output terminal of the shift register unit. A gate and a first electrode of the second transistor T2 may be coupled to an input terminal of the shift register unit, and a second electrode thereof may be coupled to the first electrode of the first capacitor C1. A gate and a first electrode of the third transistor T3 may be coupled to a reset terminal of the shift register unit, and a second electrode thereof may be coupled to a gate of the fourth transistor T4 and a gate of the fifth transistor T5. A first electrode of the fourth transistor T4 may be coupled to the output terminal of the shift register unit, and a second electrode thereof may be coupled to an inactive level voltage line. A first electrode of the fifth transistor T5 may be coupled to the first electrode of the first capacitor C1, and a second electrode thereof may be coupled to the inactive level voltage line. The first electrode and the second electrode refer to one of a source and a drain respectively.

Each of the at least one stage of the shift register unit may further comprise a sixth transistor T6, a seventh transistor T7, an eighth transistor T8, a ninth transistor T9, a tenth transistor T10, and an eleventh transistor T11. A gate of the sixth transistor T6 may be coupled to a gate of the seventh transistor T7, a first electrode thereof may be coupled to the first electrode of the first capacitor C1, and a second electrode thereof may be coupled to the inactive level voltage line Vss. A first electrode of the seventh transistor T7 may be coupled to the output terminal of the shift register unit, and a second electrode thereof may be coupled to the invalid level voltage line Vss. A gate of the eighth transistor T8 may be coupled to a second electrode of the tenth transistor T10, a first electrode of the eighth transistor T8 may be coupled to the second clock signal line, and a second electrode thereof may be coupled to the gate of the sixth transistor T6. A gate of the ninth transistor T9 may be coupled to the first electrode of the first capacitor C1, a first electrode may be coupled to the gate of the sixth transistor T6, a second electrode may be coupled to the invalid level voltage line Vss. A gate and a first electrode of the tenth transistor T10 may be coupled to the second clock signal CK2. A gate of the eleventh transistor T11 may be coupled to the first electrode of the first capacitor C1, a first electrode thereof may be coupled to the gate of the eighth transistor T8, and a second electrode thereof may be coupled to the invalid level voltage line Vss.

In another embodiment, the gate driving circuit may comprise at least two scan modules coupled to a same clock signal. Each of the at least two scan modules may have an input terminal, a reset terminal, and at least one stage of shift register unit. Among the at least two scan modules, a reset terminal of at least a current scan module may be coupled to an input terminal of a subsequent scan module. The subsequent scan module is a scan module whose corresponding display scan period is most closely subsequent to a display scan period the current scan module corresponds to. Each of the at least two scan modules may be configured to enable the at least one stage of the shift register unit thereof to output a gate turning-on voltage stage by stage, starting from the first stage, in accordance with a flip of a level of the clock signal when the input terminal thereof receives an active level and to stop the last stage of the shift register unit thereof from outputting a gate turning-on voltage when the reset terminal thereof receives an active level.

Another example of the present disclosure is a driving method of the gate driving circuit according to one embodiment of the present disclosure. The method may comprise providing an active level to an input terminal of a scan module corresponding to a display scan period at a beginning of the display scan period. The method may further comprise providing a same clock signal to the at least two scan modules and having lock signal stop flipping during each of the touch scan periods. The method may further comprise providing a touch control enable signal to a reset terminal of the scan module.

Another example of the present disclosure is an array substrate comprising the gate driving circuit according to one embodiment of the present disclosure.

Another example of the present disclosure is a display apparatus comprising the array substrate according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
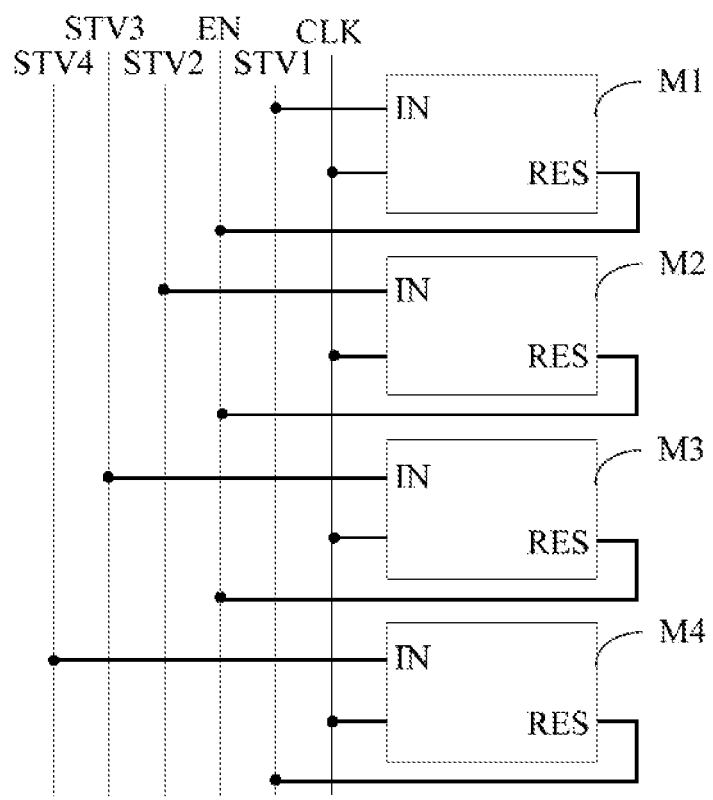
FIG. 1 is a block diagram of a gate driving circuit according to one embodiment of the present disclosure.

The present invention will be described in further detail with reference to the accompanying drawings and embodiments hi order to provide a better undemanding of the technical solutions of the present invention by those skilled in the art. Throughout the description of the invention, reference is made to FIGS. 1-6. When referring to the figures, like structures and elements shown throughout are indicated with like reference numerals.

FIG. 1 is a block diagram of a gate driving circuit according to one embodiment of the present disclosure. The gate driving circuit includes at least two scan modules. The at least two scan modules are coupled to a same clock signal line. Each of the scan modules has an input terminal and a reset terminal. The reset terminal of at least one of the at least two scan modules is coupled to a touch control enable signal line. In one embodiment, as shown in FIG. 1, there are four scan modules M1, M2, M3 and M4. The four scan modules M1, M2, M3 and M4 are coupled to the same clock signal line CLK. The reset terminals RES of the scan modules M1, M2, and M3 in FIG. 1 are coupled to a touch control enable signal line EN.

In one embodiment, each of the scan modules includes at least one stage of shift register unit. The number of the stages of shift register units may be one, five, ten, twenty, or fifty, etc. The number of stages of the shift register units in different scan modules can be different. Moreover, each of the scan modules has the following function: when an input terminal of the scan module receives an active level, internal shift register units thereof start outputting a gate turning-on voltage stage by stage, starting from the first stage, in accordance with a flip of a level of the clock signal. When a reset terminal of the scan module receives an active level, the last stage of shift register unit thereof stops outputting a gate turning-on voltage.

In one embodiment, scan module M1 includes a plurality of cascaded shift register units. For each stage of the shift register unit, when a level of a clock signal flips at first time after an input terminal thereof receives a gate turning-on voltage, the stage of the shift register unit can output a gate turning-on voltage to an output terminal thereof. Furthermore, when a reset terminal thereof receives a gate turning-on voltage, the stage of the shift register unit stops outputting a gate turning-on voltage to the output terminal thereof. When an input terminal of the first stage of shift register unit is coupled to an input terminal of the scan module M1 and a reset terminal of the last stage of shift register unit is coupled to a reset terminal of the scan module M1, the scan module M1 can achieve the above function: when an input terminal of the scan module receives an active level, internal shift register units thereof start outputting a gate turning-on voltage stage by stage, starting from the first stage, in accordance with a flip of a level of the clock signal. Furthermore, when a reset terminal of the scan module receives an active level, the last stage of the shift register unit thereof stops outputting a gate turning-on voltage. The shift register unit of this embodiment can be realized with reference to a Gate driver on Array (GOA) unit circuit in the prior art, and an example of its circuit structure is disclosed later.

Figure 2:
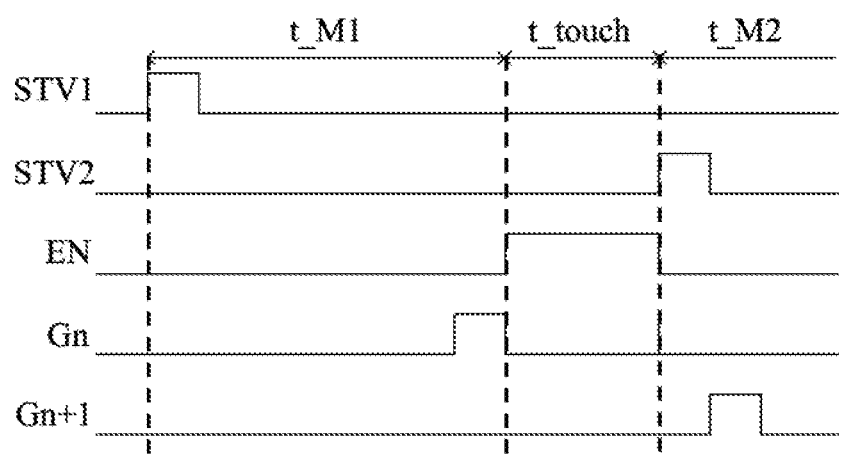
FIG. 2 is a circuit timing diagram of a gate driving circuit according tats one embodiment of the present disclosure.

FIG. 2 is a circuit timing diagram of a gate driving circuit according to one embodiment of the present disclosure. Specifically, FIG. 2 shows a partial circuit timing diagram of scan module M1 and scan module M2 according to one embodiment. A display period to which a gate driving circuit of the present embodiment corresponds comprises alternate display scan periods and touch scan periods such as display scan period t_M1, touch scan period t12, and display scan period t_M2 arranged in turn as shown in FIG. 2. After this, the display period may further include a plurality of alternate display scan periods and touch scan periods. Among the above at least two scan modules, each of the scan modules corresponds to one of the display scan periods. For example, the display scan period t_M1 in FIG. 2 corresponds to scan module M1. The display scan period t_M2 in FIG. 2 corresponds to scan module M2. The touch control enable signal line is used to load an active level signal at a reset terminal of the scan module during each of the touch scan periods. For example, as shown in FIG. 2, the touch control enable signal line EN is at a high level during the touch scan period t12 and a low level during the display scan period t_M1 and the display scan period t_M2.

Since the touch control enable signal line loads an active level at the reset terminal of the scan module during each of the touch scan periods, for each of the scan modules whose reset terminals are coupled to the touch control enable signal line, the last stage of the shift register unit thereof stops outputting a gate turning-on voltage or the last stage of the shift register unit thereof remains in a state of not outputting the gate turning-on voltage during each of the touch scan periods.

In one embodiment, as shown in FIGS. 1 and 2, scan module M1 is coupled to a start signal line STV1. Scan module M2 is couplet to a start signal line STV2. Scan module M3 is coupled to a start signal line STV3. Scan module M4 is coupled to a start signal line STV4. Each of the start signal lines is coupled to a scan control signal respectively. As such, touch scans and display scans can be performed alternately in accordance with the following procedure:

As shown in FIG. 2, at the beginning of display scan period t_M1, the start signal line STV1 outputs an active level to the input terminal of scan module M1. As a result, during display scan period t_M1, internal shift register units of scan module M1 start outputting a gate turning-on voltage stage by stage, starting from the first stage, in accordance with a flip of a level of the clock signal, until an output terminal Gn of the last stage of shift register unit thereof starts outputting a gate turning-on voltage. Then, at the beginning of the subsequent touch scan period t12, scan module M1 stops the last stage of the internal shift register unit thereof from outputting a gate turning-on voltage under an action of the active level of the touch control enable signal line EN. Accordingly, the output terminal Gn outputs a waveform as shown in FIG. 2. The active level of the touch control enable signal line EN continues until the end of the touch scan period t12. Thereafter, at the beginning of display scan period t_M2, the start signal line STV2 outputs an active level to the input terminal of scan module M2. As a result, during display scan period t_M2, internal shift register units of scan module M2 start outputting a gate turning-on voltage stage by stage, starting from the first stage, in accordance with a flip of a level of a clock signal. Accordingly, the output terminal Gn+1 of the first stage of the shift register unit of scan module M2 outputs a waveform as shown in FIG. 2. Likewise, the last stage of shift register unit of scan module M2 stops outputting a gate turning-on voltage under an action of an active level of the touch control enable signal line EN at the end of the display scan period t_M2. Then, scan module M3 starts outputting a gate turning-on voltage stage by stage at the beginning of the corresponding display scan period under an action of the start signal line STV3. The last stage of the shift register unit of scan module M3 stops outputting a gate turning-on voltage under an action of an active level on the touch control enable signal line EN at the end of the corresponding display scan period. Then, scan module M4 starts outputting a gate turning-on voltage stage by stage at the beginning of the corresponding display scan period under an action of the start signal line STV4. The last stage of the shift register unit of scan module M4 stops outputting a gate turning-on voltage under an action of the start signal line STV1 of the next display period at the end of the corresponding display scan period. As such, touch scans and display scans are performed alternately.

It can be seen that a reset terminal of at least one of the at least two scan modules is coupled to a touch control enable signal line. As such, at least a part of control signal lines can be replaced by the touch control enable signal line commonly used in a touch control circuits. As a result, this part of the control signal lines can be saved, which can not only reduce the number of signal ports, but also compress a part of wiring space, thereby facilitating simplifying circuit structure of a product and narrowing display borders.

The active and inactive levels herein refer to two different pre-configured ranges of voltages against a particular circuit node respectively. Both ranges of the voltages are based on a voltage of common terminal. For example, active levels of all circuit nodes are high levels in the digital circuit. Alternatively, active levels of all circuit nodes are low levels in the digital circuit. Alternatively, active levels of reset terminals of scan modules are high levels in the digital circuit and active levels of input terminals of scan modules are low levels in the digital circuit. This is not limited hereto.

In one embodiment, the above-described touch control enable signal line refers to a touch signal line commonly used in a touch control circuit. Typically, periods of an active level of the touch control enable signal line are completely coincident with all touch scan periods. As such, the touch control enable signal line can be used to distinguish and identify touch scan periods and non-touch scan periods. In another embodiment, a signal on a touch control enable signal line is a signal obtained after processing a signal of the touch control signal line. For example, a touch control enable signal line is a signal line coupled to a touch control signal line via a voltage follower. Alternatively, a touch control enable signal line is a signal line coupled to a touch control signal line via a step-up conversion circuit. This is not limited hereto. In addition, in one embodiment, the touch control enable signal line may be coupled to reset terminals of any number or any combination of scan modules among the at least two scan modules included in the gate driving circuit. The more the number of connected scan modules is, the more conducive to reduce the number of signal ports and compress the wiring space.

Figure 3:
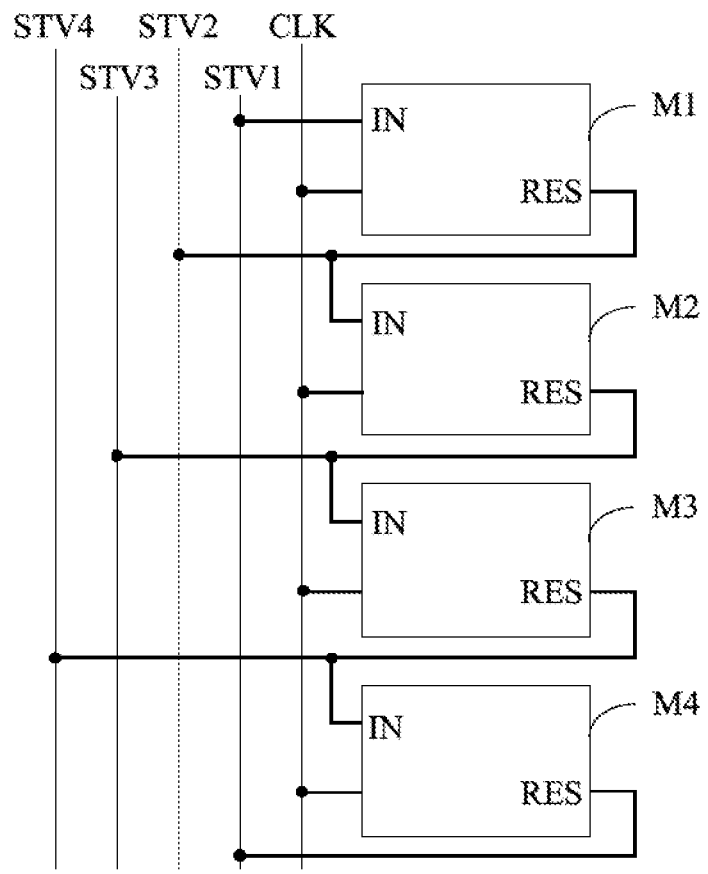
FIG. 3 is a block diagram of a gate (hiving circuit according to one embodiment of the present disclosure.

FIG. 3 shows a block diagram of a gate driving circuit according to one embodiment of the present disclosure. The gate driving circuit of the present embodiment includes at least two scan modules. The at least two scan modules are coupled to a same clock signal. Each scan module has an input terminal and a reset terminal. The input terminal of each of the at least two scan modules is coupled to a start signal line respectively. In addition, a reset terminal of at least one of the at least two scan modules is coupled to an input terminal of a subsequent scan module. In one embodiment as shown in FIG. 3, a gate driving circuit includes four scan modules, M1, M2, M3 and M4. The four scan modules M1, M2, M3 and M4 are coupled to the same clock signal line CLK. Furthermore, an input terminal IN of scan module M1 is coupled to a start signal line STV1. An input terminal IN of scan module M2 is coupled to a start signal line STV2. An input terminal IN of scan module M3 is coupled to a start signal line STV3. An input terminal IN of scan module M4 is coupled to a start signal line STV4. In addition, a reset terminal RES of scan module M1 is coupled to an input terminal IN of scan module M2. A reset terminal RES of scan module M2 is coupled to an input terminal IN of scan module M3. A reset terminal RES of scan module M3 is coupled to an input terminal IN of scan module M4. A reset terminal RES of scan module M4 is coupled to an input terminal IN of scan module M1.

In one embodiment, each of the scan modules includes at least one stage of shift register unit. The number of the stages of shift register units may be one, five, ten, twenty, or fifty, etc. The number of stages of the shift register units in different scan modules can be different. Moreover, each of the scan modules has the following function: when an input terminal of the scan module receives an active level, internal shift register units thereof start to output a gate turning-on voltage stage by stage, starting from the first stage, in accordance with a flip of a level of the clock signal. When a reset terminal of the scan module receives an active level, the last stage of shift register unit thereof stops outputting a gate turning-on voltage.

In one embodiment, a scan module M1 includes a plurality of cascaded shift register units. For each stage of the shift register unit, when a level of a clock signal flips at the first time after an input terminal thereof receives a gate turning-on voltage, the stage of the shift register unit can output a gate turning-on voltage to an output terminal thereof. Furthermore, when a reset terminal thereof receives a gate turning-on voltage, the stage of the shift register unit stops outputting a gate turning-on voltage to the output terminal thereof. When an input terminal of the first stage of shift register unit is coupled to an input terminal of the scan module M1 and a reset terminal of the last stage of shift register unit is coupled to a reset terminal of the scan module M1, the scan module M1 can achieve the following function: when an input terminal of the scan module receives an active level, internal shift register units thereof start outputting a gate turning-on voltage stage by stage, starting from the first stage, in accordance with a flip of a level of the clock signal. Furthermore, when a reset terminal of the scan module receives an active level, the last stage of the shift register unit thereof stops outputting a gate turning-on voltage. The shift register unit of this embodiment can be realized with reference to a Gate driver on Array (GOA) unit circuit in the prior art, and an example of its circuit structure is disclosed later.

Figure 4:
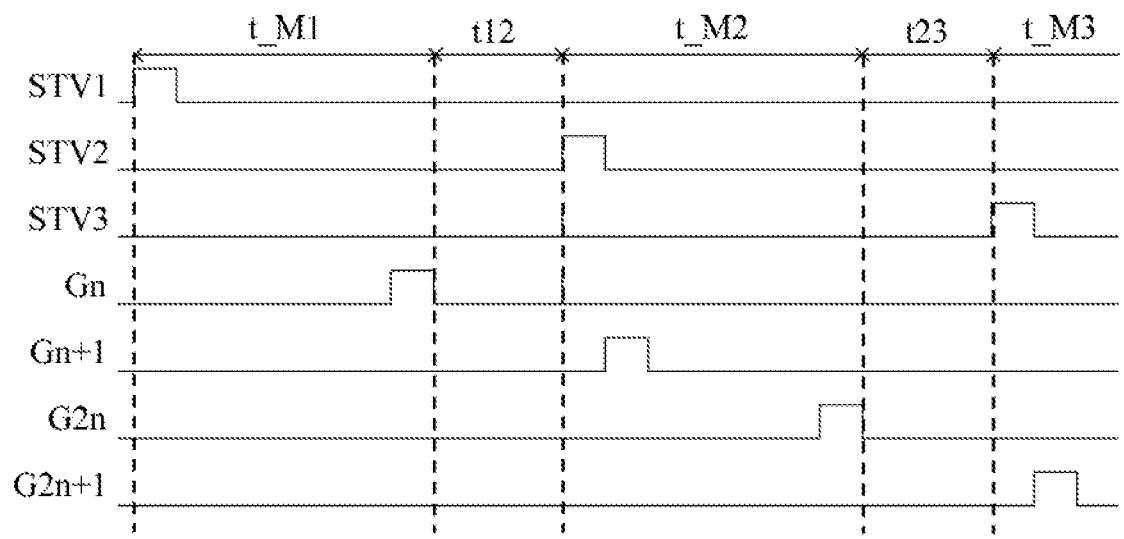
FIG. 4 is a circuit timing diagram of a gate driving circuit according to one embodiment of the present disclosure.

FIG. 4 is a circuit timing diagram of a gate driving circuit according to one embodiment of the present disclosure. Specifically, FIG. 4 shows partial circuit timing diagram of scan module M1, scan module M2 and scan module M3. A display period to which the gate driving circuit of the present embodiment corresponds includes alternate display scan periods and touch scan periods. As shown in FIG. 4, the display period includes display scan period t_M1, touch scan period t12, display scan period t_M2, touch scan period t23, display scan period t_M3, which are arranged in turn. The display period may further include a plurality of alternate display scan periods and touch scan periods after those shown in FIG. 4. Among the above at least two scan modules, each of the scan modules corresponds to a display scan period. For example, as shown in FIG. 4, display scan period t_M1 corresponds to scan module M1. Display scan period t_M2 corresponds to scan module M2. Display scan period t_M3 corresponds to scan module M3. For each of the scan modules of the present embodiment, a subsequent scan module of a current scan module is one whose corresponding display scan period is closely subsequent to the corresponding display scan period of the current scan module. That is, a reset terminal of each of the scan modules is coupled to a start signal line respectively. For two scan modules coupled to a same start signal line, a display scan period corresponding to a scan module whose reset terminal is coupled to the same start signal line and a display scan period corresponding to a scan module whose input terminal is coupled to the same start signal line are disposed immediately before and after a same touch scan period respectively, or disposed as the last display scan period of a display period and the first display scan period of the next display period respectively. For example, as shown in FIG. 4, for scan module M2 that corresponds to display scan period t_M2, display scan period t_M3 is most closely subsequent to display scan period t_M2. Thus, the scan module M3 corresponding to scan period t_M3 is the subsequent scan module of scan module M2. Furthermore, the display scan period corresponding to scan module M4 is the last display scan period of the display period, and its most closely subsequent display scan period is the first display scan period of the next display period, that is, the display scan period t_M1 which corresponds to scan module M1. Therefore the subsequent scan module of scan module M4 is scan module M1.

As shown in FIGS. 3 and 4, In a case where each of the start signal lines is coupled to a scan control signal respectively, alternate touch scans and display scans can be performed using the following method:

As shown in FIG. 4, at the beginning of display scan period t_M1, a start signal line STV1 outputs an active level to an input terminal of scan module M1. As a result, scan nodule M1 enables internal shift register units thereof to output a gate turning-on voltage stage by stage, starting from the first stage, in accordance with a flip of a level of a clock signal in the corresponding display scan period t_M1, until an output terminal Gn of the last stage of the shift register unit starts outputting a gate turning-on voltage. Then, at the beginning of a subsequent touch scan period t12, the voltage line for providing the gate turning-on voltage temporally stops providing the gate turning-on voltage. As such, the output terminal Gn does not output a gate turning-on voltage during the touch scan period t12. Thereafter, at the beginning of a display scan period t_M2, a start signal line STV2 outputs an active level to both an input terminal of scan module M2 and a reset terminal of scan module M1. As a result, the last stage of the shift register unit of the scan module M1 stops outputting a gate turning-on voltage. Accordingly, the output terminal Gn outputs a waveform as shown in FIG. 4. Under an action of an active level of the start signal line STV2, scan module M2 enables its internal shift register units to output a gate turning-on voltage stage by stage, starting from the first stage, in accordance with a flip of a level of a clock signal in the corresponding display scan period t_M2. For example, an output terminal Gn+1 of the first stage of the shift register unit of scan module M2 outputs a waveform as shown in FIG. 4. Likewise, an output terminal. G2$n$ of the last stage of the shift register unit of scan module M2 does not output a gate turning-on voltage during touch scan period t23. The output terminal G2$n$ stops outputting a gate turning-on voltage under an action of an active level of the start signal line STV2 at the beginning of the display scan period t_M3. Accordingly, a waveform as shown in FIG. 4 is formed. At the beginning of the display scan period t_M3, scan module M3 starts outputting a gate turning-on voltage stage by stale under an action of the start signal line STV3. For example, an output terminal G2n+1 of the first stage of shift register unit of scan module M3 outputs a waveform as shown in FIG. 4. At the beginning of the display scan period corresponding to scan module M4, the last stage of shift register unit of scan module M3 stops outputting a gate turning-on voltage under an action of an active level on the start signal line STV4. Scan module M4 starts outputting a gate turning-on voltage stage by stage under an action of the start signal line STV4 at the beginning of the corresponding display scan period. At the beginning of the display scans period t_M1, the last stage of the shift register unit of scan module M4 stops outputting a gate turning-on voltage under an action of an active level of the start signal line STV1 of the next display period. As a result, touch scans and display scans are performed alternately.

It can be seen that a reset terminal of at least one of the at least two scan modules is coupled to an input terminal of the subsequent scan module thereof. The embodiment of the present disclosure can reduce the number of control signal lines by sharing a part of control signal lines. It can not only reduce the number of signal ports, but also compress a part of wiring space, thereby facilitating simplifying circuit structure of a product and narrowing display borders.

The active and inactive levels herein refer to two different pre-configured ranges of voltages against a particular circuit node respectively. Both ranges of the voltages are based on a voltage of common terminal. For example, active levels of all circuit nodes are high levels in the digital circuit. Alternatively, active levels of all circuit nodes are low levels in the digital circuit. Alternatively, active levels of reset terminals of scan modules are high levels in the digital circuit and active levels of input terminals of scan modules are low levels in the digital circuit. This is not limited hereto.

It is to be noted that among the at least two scan modules included in the gate driving circuit, there may be any number or combination of scan modules whose reset terminals are coupled to an input terminal of a subsequent scan module respectively. The more the number of scan modules whose reset terminals are coupled to the input terminal of the subsequent scan module respectively, the more the number of signal ports is reduced and the more wiring space is compressed.

In another embodiment, a gate driving circuit includes at least two scan modules. A reset terminal of at least one of the at least two scan modules is coupled to a touch control enable signal line. A reset terminal of at least one of the at least two scan modules other than scan modules whose reset terminals are coupled to the touch control enable signal line is coupled to an input terminal of the subsequent scan module thereof. As such, a combination of the above two methods can reduce the number of the control signal lines. This can not only reduce the number of signal ports, but also compress a part of wiring space, thereby facilitating simplifying circuit structure of a product and narrowing display borders.

In another embodiment, a gate driving circuit includes at least two scan modules. Input terminals of the at least two scan modules are coupled to start signal lines respectively. A reset terminal of the scan module corresponding to the last display scan period in the display period is coupled to an input terminal of the scan module corresponding to the first display scan period in the display period. As shown in FIG. 1 and FIG. 4, a reset terminal RES of scan module M4 corresponding to the last display scan period in the display period is coupled to an input terminal IN of scan module M1 corresponding to the first display scan, period in the display period. As such, the signal line coupled to the input terminal of the first scan module corresponding to the first scan period in the display period can be utilized to reset the scan module corresponding to the last display scan period in the previous display period. As a result, the number of the control signal lines can be further reduced. This can not only reduce the number of signal ports, but also compress a part of the wiring space, thereby facilitating simplifying circuit structure of a product and narrowing display borders.

In one embodiment, in any of the above-described gate driving circuits, a shift register unit included in the scan module may have an input terminal, an output terminal, and a reset terminal. An input terminal of the first stage of the shift register unit of each scan module is coupled to an input terminal of the scan module. A reset terminal of the last stage of shift register unit of each scan module is coupled to a reset terminal of the scan module. Furthermore, in a scan module having more than one stage of shift register units, except the first stage of the shift register unit, an input terminal of any of the remaining stages of shift register units is coupled to an output terminal of the previous stage of shift register unit. Except the last stage of shift register unit, a reset terminal of any of the remaining stages of shift register units is coupled to the output terminal of the next stage of shift register unit. As such, the function of the above-described scan module can be realized according to the above-described examples of the shift register units.

Figure 5:
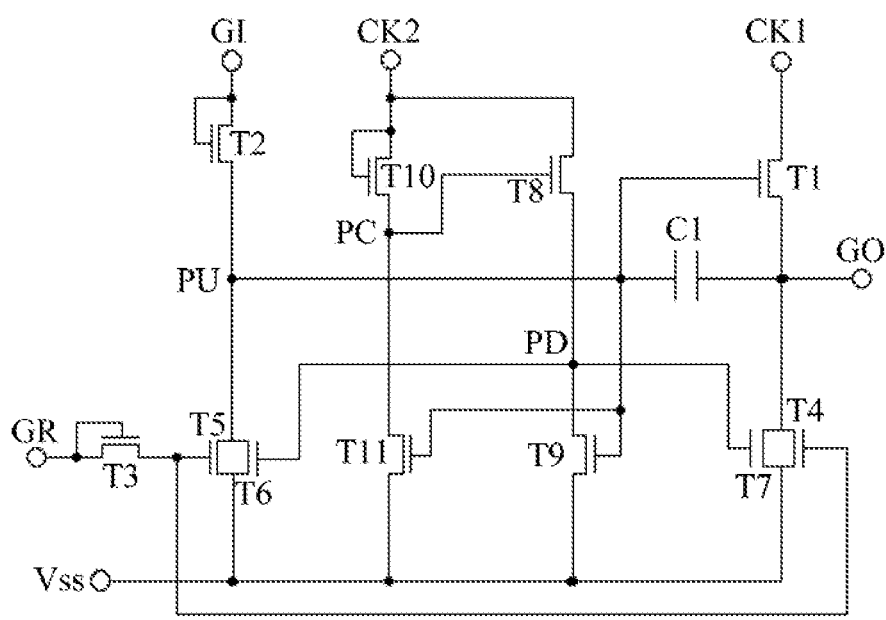
FIG. 5 is a circuit diagram of a shift register unit according to one embodiment of the present disclosure.
Figure 6:
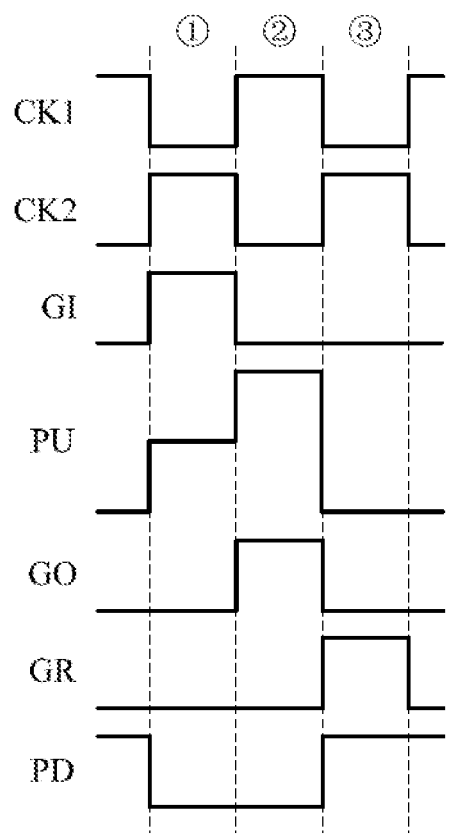
FIG. 6 is a circuit timing diagram of a shift register unit according to one embodiment of the present disclosure.

FIG. 5 shows a circuit diagram of a shift register unit according to one embodiment of the present disclosure. FIG. 6 shows a circuit timing diagram corresponding to the shift register unit. In one embodiment, the clock signals include positive phase clock signals and inverted phase clock signals provided by first clock signal line CK1 and second clock signal line CK2 respectively. The first clock signal line CK1 of the shift: register unit which is coupled to an odd numbered scan line is loaded with a positive phase clock signal. The second clock signal line CK2 thereof is loaded with an inverted phase clock signal. The first clock signal line CK1 of the shift register unit which is coupled to an even numbered scan line is loaded with the inverted clock signal. The second clock signal line CK2 thereof is loaded with the positive phase clock signal. In one embodiment, the transistors shown in FIG. 5 are all N-type transistors, which can be manufactured by a same production method to lower manufacturing cost. According to the specific type of transistors, connections for the source and the drain thereof can be set respectively to match a direction of a current flowing through the transistor. When a transistor has a structure in which the source and the drain thereof are symmetrical, the source and the drain can be regarded as two electrodes that are not specifically differentiated. Hereinafter, a first electrode and a second electrode denote one of the source and the drain respectively.

As shown in FIG. 5, the shift register unit includes a first transistor T1, a first capacitor C1, a second transistor T2, a third transistor T3, a fourth transistor T4, and a fifth transistor T5. A gate of the first transistor T1 is coupled to a first node PU. A first electrode thereof is coupled to a first clock signal line CK1. A second electrode thereof is coupled to an output terminal GO of the shift register unit. The first and the second electrodes are one of the source and the drain respectively. A first electrode of the first capacitor C1 is coupled to the first node PU. A second electrode thereof is coupled to the output terminal GO of the shift register unit.

A gate and a first electrode of the second transistor T2 are coupled to an input terminal GI of the shift register unit. A second electrode thereof is coupled to the first node PU. A gate and a first electrode of the third transistor T3 are coupled to a reset terminal GR of the shift register unit. A second electrode thereof is coupled to a gate of the fourth transistor T4 and a gate of the fifth transistor T5. A first electrode of the fourth transistor T4 is coupled to the output terminal GO of the shift register unit. A second electrode thereof is coupled to an inactive level voltage line Vss. A first electrode of the fifth transistor T5 is coupled to the first node PU, and a second electrode thereof is coupled to the inactive level voltage line Vss.

With a combination of the first transistor T1, the first capacitor C1, the second transistor T2, the third transistor T3, the fourth transistor T4, and the fifth transistor T5, the shift register unit can start outputting a gate turning-on voltage to the output terminal GO thereof when an voltage level of the first clock signal flips at the first time after the input terminal GI thereof receives a gate turning-on voltage. The shift register unit can stop outputting a gate turning-on voltage to the output terminal GO thereof when the reset terminal GR receives a gate turning-on voltage.

In another embodiment, as shown in FIG. 5, the shift register unit further includes a sixth transistor T6, a seventh transistor T7, an eighth transistor T8, a ninth transistor T9, a tenth transistor T10, and an eleventh transistor T11. A gate of the sixth transistor T6 is coupled to a second node PD. A first electrode thereof is coupled to the first node PU, a second electrode thereof is coupled to the invalid level voltage line Vss. A gate of the seventh transistor T7 is coupled to the second node PD. A first electrode thereof is coupled to the output terminal GO of the shift register unit. A second electrode thereof is coupled to the invalid level voltage line Vss. A gate of the eighth transistor T8 is coupled to a third node PC. A first electrode of the eighth transistor T8 is coupled to the second clock signal line CK2, and a second electrode thereof is coupled to the second node PD. A gate of the ninth transistor T9 is coupled to the first node PU. A first electrode thereof is coupled to the second node PD, a second electrode thereof is coupled to the invalid level voltage line Vss. A gate and a first electrode of the tenth transistor T10 are coupled to the second clock signal line CK2. A second electrode thereof is coupled to the third node PC. A gate of the eleventh transistor T11 is coupled to the first node PU. A first electrode thereof is coupled to the third node PC and a second electrode thereof is coupled to the invalid level voltage line Vss.

With a combination of the sixth transistor T6, the seventh transistor T7, the eighth transistor T8, the ninth transistor T9, the tenth transistor T10, and the eleventh transistor T11, the shift register unit can fulfill the above function with additional advantages such as less output noise and better operating stability.

Referring to FIGS. 5 and 6, an operational principle of the above shift register unit is described as follows:

Prior to a first stage ①, the input terminal GI and the reset terminal GR of the shift register unit are maintained at a low level. Thus, the second transistor T2, the third transistor T3, the fifth transistor T5, and the fourth transistor T4 remain tuned off. The clock signals on the first clock signal line CK1 and the second clock signal line CK2 flip periodically so that the tenth transistor T10 turns on periodically and the third node PC is set at a high level periodically. Then, the eighth transistor T8 is turned on so that the second node PD is set at a high level. Under an action of the high level of the second node PD, the sixth transistor T6 and the seventh transistor T7 are turned on so that the first node PU and the output terminal GO remain at a low level. The ninth transistor T9 and the eleventh transistor T11 remain turned off so that potentials of the second node PD and the third node PC are not pulled down. The first transistor T1 remains closed so that the potential at the output terminal GO is not pulled up.

During the first stage ①, the input terminal GI is changed to be at a high level. The second clock signal line CK2 is at a high level, and the first clock signal line CK1 is at a low level. As such, the second transistor T2 is turned on so that the first node PU is pulled up to a high level. As a result the first transistor T1, the ninth transistor T9, and the eleventh transistor T11 are turned on. The second node PD and the third node PC are set at a low level, and the potentials of the first node PU and the output terminal GO are stopped being pulled down. Since the first transistor T1 is turned on, the output let terminal GO remains at the low level under an action of the first clock signal line CK1. During this stage, the first terminal of the first capacitor C1 is at a high level and the second terminal thereof is at a low level. That is, charging of both terminals of the capacitor is completed during this stage.

During the second stage ②, the input terminal GI is changed to be at a low level. The second clock signal line CK2 is at a low level and the first clock signal line CK1 is at a high level. Under an action of charge retention effect of the first capacitor C1, the first node PU jumps to a level higher than a high potential as the first clock signal line CK1 changes from a low level to a high level. As such, the first transistor T1 is fully turned on and the potential at the output terminal GO is pulled up quickly. That is, the output terminal GO starts outputting a gate turning-on voltage.

During the third stage ③, the reset terminal GR is changed to be a high level. The second clock signal line CK2 is at the high level. The first clock signal line CK1 is at the low level. Under an action of the high level at the reset terminal GR, the third transistor T3 is turned on. As such, the fifth transistor T5 pulls down the potential at the first node PU. The fourth transistor T4 pulls down the potential at the output terminal GO. As a result, the first node PU is set at a low level. Furthermore, the ninth transistor T9 stops pulling down the potential at the second node PD. The eleventh transistor T11 stops polling down the potential at the third node PC. Under an action of a high level on the second clock signal line CK2, the tenth transistor T10 is turned on and the third node PC is set at a high level. Then, the eighth transistor T8 is turned on and the second node PD is set at a high level. After that, under an action of the high level of the second node PD, the sixth transistor T6 and the seventh transistor T7 are turned on and accordingly the first node PU and the output terminal GO are set at a low level. That is, outputting of the gate turning-on voltage is stopped. Thereafter, the shift register unit continues to be in a state as prior to the first stage ① until the first stage of next period starts.

As can be seen from the above principle of operation, the shift register unit starts outputting a gate turning-on voltage to the output terminal GO thereof when the level of the clock signal flips at the first time after the input terminal GI thereof receives a gate turning-on voltage. Furthermore, the shift register unit stops outputting a gate turning-on voltage to the output terminal GO thereof when the reset terminal GR receives a gate turning-on voltage. Moreover, the shift register unit has a certain capability in resisting noise and maintaining the output signal stable. Thus, any one of the above-described scan modules and any of the above-described gate driving circuits can be formed using, for example, the shift register unit according to one embodiment.

Based on the same inventive concept, in one embodiment, a driving method for the gate driving circuit according to one embodiment of the present disclosure is provided. The driving method includes: at the beginning of any of the display scan periods, the input terminal of the scan module corresponding to the display scan period is set at an active level. As such, an operational timing of the gate driving circuit shown in FIG. 2 or FIG. 4 can be realized. In addition, the driving method of the present embodiment may further include: providing the same clock signal to the at least two scan modules, and having the clock signal temporarily stop flipping during each of the touch scan periods. As a result, during each of the touch scan periods, outputting of the gate turning-on voltage stage by stage is suspended. The suspension of provision of the gate turning-on voltage during each of the above-mentioned touch scan periods can be realized in conjunction with the circuit structure shown in FIG. 5.

Based on the same inventive concept, in another embodiment, an array substrate is provided. The array substrate includes the gate driving circuit according to one embodiment of the present disclosure. It is possible to reduce the number of control signal lines for achieving alternation of touch scans and display scans in any of the above-described gate driving circuits so that the gate driving circuit has simpler circuit structure and smaller footprint thereof. As a result, the array substrate can have a smaller GOA region so that it is possible for the array substrate to achieve at least one of the following: increasing display area, reducing a size of the array substrate, and narrowing borders.

Based on the same inventive concept, in another embodiment, a display apparatus is provided. The display apparatus includes any of the array substrates according to one embodiment of the present disclosure. The display apparatus in the embodiment of the present disclosure may be a display panel, a mobile phone, a tablet computer, a television, a monitor, a notebook computer, a digital photo frame, a navigator, or any product or component having display capability. It can be seen that, based on any of the above-described gate driving circuits and any of the above-described array substrates and the features thereof, it is possible for the display apparatus to achieve at least one of the following advantages: increasing screen area, reducing panel size and narrowing borders.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A gate driving circuit comprising:
    four scan modules coupled to a same clock signal, each of the four scan modules having an input terminal, a reset terminal, and at least one stage of shift register unit, wherein the reset terminal of each of the four scan modules except the last stage scan module is coupled to one same touch control enable signal line, and the reset terminal of the last stage scan module is coupled to a first start signal line and the input terminal of the first stage scan module,
    wherein each of the four scan modules is configured to enable the at least one stage of the shift register unit thereof to output a gate turning-on voltage stage by stage, starting from the first stage, in accordance with a flip of a level of the clock signal when the input terminal thereof receives an active level and to stop the last stage of the shift register unit thereof from outputting a gate turning-on voltage when the reset terminal thereof receives an active level,
    wherein a display period the gate driving circuit corresponds to includes alternate display scan periods and touch scan periods, and each of the four modules corresponds to one of the display scan periods respectively, and
    wherein the touch control enable signal line is configured to load an active level at the reset terminal during each of the touch scan periods.

2. The gate driving circuit according to claim 1, wherein each of input terminals of the four scan modules is coupled to a start signal line respectively.

3. The gate driving circuit according to claim 1, wherein each of the at least one stage of the shift register unit comprises:
    an input terminal;
    an output terminal; and
    a reset terminal;
    wherein an input terminal of a first stage of shift register unit in a scan module is coupled to an input terminal of the scan module; and a reset terminal of a last stage of shift register unit in the scan module is coupled to a reset terminal of the scan module.

4. The gate driving circuit according to claim 3, wherein in a scan module having more than one stage of shift register units, except a first stage of the shift register, an input terminal of any of the remaining stages of shift register units is coupled to an output terminal of a previous stage of shift register unit, and
    except a last stage of the shift register unit, a reset terminal of any of the remaining stages of shift register units is coupled to a output terminal of a next stage of shift register unit.

5. The gate driving circuit according to claim 1, wherein the clock signal is provided by a first clock signal line and a second clock signal line.

6. The gate driving circuit according to claim 5, wherein each of the at least one stage of the shift register unit comprises a first transistor, a first capacitor, a second transistor, a third transistor, a fourth transistor, and a fifth transistor, wherein
    a gate of the first transistor is coupled to a first electrode of the first capacitor C1, a first electrode thereof is coupled to the first clock signal line, a second electrode thereof is coupled to an output terminal of the shift register unit,
    a second electrode of the first capacitor C1 is coupled to the output terminal of the shift register unit;
    a gate and a first electrode of the second transistor T2 are coupled to an input terminal of the shift register unit, and a second electrode thereof is coupled to the first electrode of the first capacitor C1;
    a gate and a first electrode of the third transistor T3 are coupled to a reset terminal of the shift register unit, and a second electrode thereof is coupled to a gate of the fourth transistor T4 and a gate of the fifth transistor T5;

a first electrode of the fourth transistor T4 is coupled to the output terminal of the shift register unit, and a second electrode thereof is coupled to an inactive level voltage line; and a first electrode of the fifth transistor T5 is coupled to the first electrode of the first capacitor C1, and a second electrode thereof is coupled to the inactive level voltage line, wherein the first electrode and the second electrode refer to one of a source and a drain respectively.

7. The gate driving circuit according to claim 6, wherein each of the at least one stage of the shift register unit further comprises a sixth transistor T6, a seventh transistor T7, an eighth transistor T8, a ninth transistor T9, a tenth transistor T10, and an eleventh transistor T11, wherein a gate of the sixth transistor T6 is coupled to a gate of the seventh transistor T7, a first electrode thereof is coupled to the first electrode of the first capacitor C1, a second electrode thereof is coupled to the inactive level voltage line Vss;

a first electrode of the seventh transistor T7 is coupled to the output terminal of the shift register unit, and a second electrode thereof is coupled to the invalid level voltage line Vss;

a gate of the eighth transistor T8 is coupled to a second electrode of the tenth transistor T10, a first electrode of the eighth transistor T8 is coupled to the second clock signal line, and a second electrode thereof is coupled to the gate of the sixth transistor T6;

a gate of the ninth transistor T9 is coupled to the first electrode of the first capacitor C1, a first electrode is coupled to the gate of the sixth transistor T6, a second electrode is coupled to the invalid level voltage line Vss;

a gate and a first electrode of the tenth transistor T10 are coupled to the second clock signal line CK2, and a gate of the eleventh transistor T11 is coupled to the first electrode of the first capacitor C1, a first electrode thereof is coupled to the gate of the eighth transistor T8, and a second electrode thereof is coupled to the invalid level voltage line Vss.

8. A driving method of the gate driving circuit according to claim 1, comprising:

providing an active level to an input terminal of a scan module corresponding to a display scan period at a beginning of the display scan period.

9. The driving method according to claim 8, further comprising:

providing a same clock signal to the four modules; and having the clock signal stop flipping during each of the touch scan periods.

10. The driving method according to claim 8, further comprising:

providing a touch control enable signal to a reset terminal of the scan module.

11. An array substrate comprising the gate driving circuit according to claim 1.

12. A display apparatus comprising the array substrate according to claim 11.

* * * * *